(12) United States Patent
Hsu et al.

(10) Patent No.: US 6,482,675 B2
(45) Date of Patent: Nov. 19, 2002

(54) SUBSTRATE STRIP FOR USE IN PACKAGING SEMICONDUCTOR CHIPS AND METHOD FOR MAKING THE SUBSTRATE STRIP

(75) Inventors: Kao-Yu Hsu, Kaohsiung Hsien (TW); Shih Chang Lee, Kaohsiung Hsien (TW); Wei-Chun Kung, Kaohsiung (TW)

(73) Assignee: Advanced Semiconductor Engineering Inc. (TW)

( * ) Notice: Subject to any disclaimer, the term of this patent is extended or adjusted under 35 U.S.C. 154(b) by 0 days.

(21) Appl. No.: 09/878,195

(22) Filed: Jun. 12, 2001

(65) Prior Publication Data

US 2001/0049159 A1 Dec. 6, 2001

Related U.S. Application Data

(62) Division of application No. 09/434,261, filed on Nov. 5, 1999, now Pat. No. 6,262,490.

(51) Int. Cl.[7] .................................................. H01L 21/44
(52) U.S. Cl. ...................... 438/106; 438/110; 438/112; 438/127
(58) Field of Search .................................. 438/118, 106, 438/107, 110, 111, 112, 113, 121, 123, 124, 126, 127; 257/778, 666, 678, 787

(56) References Cited

U.S. PATENT DOCUMENTS

| | | | |
|---|---|---|---|
| 5,538,902 A | * 7/1996 | Izu et al. ........................ 437/2 |
| 5,542,171 A | 8/1996 | Juskey et al. |
| 5,635,671 A | * 6/1997 | Freyman et al. ........... 174/52.2 |
| 5,866,949 A | 2/1999 | Schueller |
| 5,961,912 A | 10/1999 | Huang et al. |
| 5,969,427 A | 10/1999 | Wensel |
| 6,083,775 A | * 7/2000 | Hunag et al. ................ 438/118 |
| 6,117,708 A | 9/2000 | Wensel |

* cited by examiner

Primary Examiner—Michael Sherry
Assistant Examiner—Scott Geyer

(57) ABSTRACT

A flexible substrate strip comprises a plurality of substrate units adapted for mounting semiconductor chips. The surface of the flexible substrate strip is provided with a plurality of degating regions at locations such that the edges of mold runners and gates of a mold used to encapsulate the semiconductor chips in encapsulant material fit entirely within the degating regions when the substrate strip is placed in the mold during encapsulation of the semiconductor chips. The present invention is characterized in that each degating region has a buffer region at a location corresponding to the gate of the mold during encapsulation. The degating regions have a degating region material formed thereon with the buffer regions not coated with the degating region material. The adhesive force between the encapsulant material and the degating region material is less than the adhesive force between the encapsulant material and the substrate. The present invention also provides a method of making the flexible substrate strip.

11 Claims, 5 Drawing Sheets

SUBSTRATE STRIP FOR USE IN PACKAGING SEMICONDUCTOR CHIPS AND METHOD FOR MAKING THE SUBSTRATE STRIP

This application is a divisional of application Ser. No., 09/434,261 filed Nov. 5, 1999 now U.S. Pat. No. 6,262,490.

BACKGROUND OF THE INVENTION

1. Field of the Invention

This invention relates to a flexible substrate strip for use in forming a plurality of substrate-based semiconductor chip packages wherein the excess encapsulant can be removed without damaging the packaged electronic device after encapsulating the semiconductor chip.

2. Description of the Related Art

As the need for lighter and more complicated semiconductor devices becomes greater day by day, the semiconductor chips have become more and more complex thereby requiring more electrical connections. Therefore, the ball grid array (BGA) has been developed by the semiconductor chip packaging industry to meet these needs.

A typical BGA package generally includes a chip mounted to the upper surface of a substrate i.e. a printed circuit board. Bonding pads on the active surface of the chip are connected to electrically conductive traces formed on the upper surface of the substrate by bonding wires. The lower surface of the substrate is provided with a plurality of solder pads electrically connected to the electrically conductive traces. Each solder pad is mounted with a solder ball for making external electrical connection. A package body is formed to enclose the chip, the bond wires and a portion of the upper surface of the substrate including most of the electrically conductive traces. The package body is typically formed by a transfer molding process.

FIG. 1 is a top plan view of a conventional transfer molding equipment with flexible substrate strips attached. As shown, the molding equipment includes three transfer pots 201 for accommodating encapsulant. Each transfer pot 201 of the molding equipment has a 25 transfer ram 204 positioned therein and is connected to four gates 208 through a mold runner 206. Each gate 208 is connected to a cavity 210. Two flexible substrate strips 230 are placed in the molding equipment in a manner that each substrate unit of the strips 230 adapted for mounting a semiconductor chip is corresponding to each cavity 210 of the molding equipment.

After the encapsulant is loaded in the transfer pots 201 and the flexible substrate strips 230 are fixed and clamped by the molding equipment, the transfer ram 204 is moved downwardly to compress the encapsulant. The molding equipment and encapsulant are pre-heated so that when the transfer ram 204 compresses the encapsulant, the liquefied 5 encapsulant is forced through the mold runners 206 and gates 208 to fill the cavities 210 and thereby encapsulating the semiconductor chips (not shown) mounted on the flexible substrate strips 230. After the encapsulant fills the cavities 210, the transfer ram 204 stands still for a predetermined time until the encapsulant cures. Then the transfer ram 204 is withdrawn, the molding equipment is opened, and the molded products are removed from the molding 10 equipment. Extra parts such as runners and gates are removed from the molded products, and then the molded products are cut into individual units, whereby the semiconductor chip packages are completed.

However, one shortcoming of the above process is apparent. Specifically, the encapsulant not only fills the cavities 210 but also fills the gates 208, the mold runners 206 and the transfer pots 201. Therefore, when the encapsulant is cured, the cured encapsulant not only covers the semiconductor chips, but also extends along the surface of the flexible substrate strip 230, where the gates 208 and the mold runners 206 are located, and into the pots 201. This excess cured encapsulant is often referred to as the "runner" and must be removed before the molded products are singulated. Accordingly, the gate 208 is generally made smaller in cross-sectional area than the mold runner 206 in order to assist in the "degating" process, i.e., the removal of the excess encapsulant. However, the encapsulant tends to adhere to the surface of the substrate, so the removal of the excess encapsulant is likely to twist the flexible substrate strip and causes damage to the surface thereof.

Therefore, it is desirable to provide degating regions 220 on the flexible substrate strip 230 such that the edges of mold runners 206 and gates 208 fit entirely within the degating regions 220 during encapsulation of the chips. Typically, a degating region material such as gold is formed on the degating regions wherein the adhesive force between the encapsulant and the degating region material is less than the adhesive force between the encapsulant and the substrate whereby the excess encapsulant can be removed without damaging the flexible substrate strip.

FIG. 2 is a partial side view of a packaged product 240 with to-be-removed excess encapsulant. As shown in FIG. 2, the gate 208 (for simplicity, the mold runner 206 and the transfer pot 201 are not shown in FIG. 2) is still linked with the packaged product 240. After degating, it is desirable to have a substantially regular breaking surface as shown in FIG. 3. However, there is nearly no resistance force during the removal of the excess encapsulant from the degating region, hence the breaking force is so violent as to generate the defect results as shown in FIG. 4 and FIG. 5. FIG. 4 shows a bulge 242 protruding from the outline of the packaged product. The bulge 242 will cause damage to the punch tool during the singulation process. FIG. 5 shows a concave 244 formed in the packaged product. If the damage caused by the formation of the concave 244 is severe enough, it may harm electrically conductive traces on the flexible substrate strip. Even if there is no direct damage to the substrate, the concave 244 resulting from the degating process may still weaken the seal between the molded body and the upper surface of the substrate, thereby increasing the chances of moisture penetration in the packaged product.

SUMMARY OF THE INVENTION

It is a primary object of the present invention to provide a flexible substrate strip for use in forming a plurality of semiconductor chip packages wherein each degating region of the flexible substrate strip is provided with a buffer region formed therein for alleviating the breaking force during degating process thereby obtaining a substantially regular breaking surface.

A flexible substrate strip in accordance with the present invention comprises a plurality of substrate units adapted for mounting semiconductor chips. The flexible substrate strip is provided with a plurality of degating regions in such manner that the edges of mold runners and gates of a mold used to encapsulate the semiconductor chips in encapsulant material fit entirely within the degating regions when the substrate strip is placed in the mold during encapsulation of the semiconductor chips. The present invention is characterized in that each degating region has a buffer region at a location corresponding to the gate of the mold during encapsulation. The degating regions have a degating region material formed thereon while the buffer regions are not coated with the degating region material. The adhesive force between the encapsulant material and the degating region material is less than the adhesive force between the encapsulant material and the substrate strip.

Since the buffer regions have no degating region material formed thereon, the surface of the buffer regions has the same characteristics as the substrate strip. Accordingly, the better adhesion of the encapsulant to the surface of the buffer regions helps to alleviate the violent breaking force during the degating process thereby rendering the breaking surface formed on the packaged product more regular.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
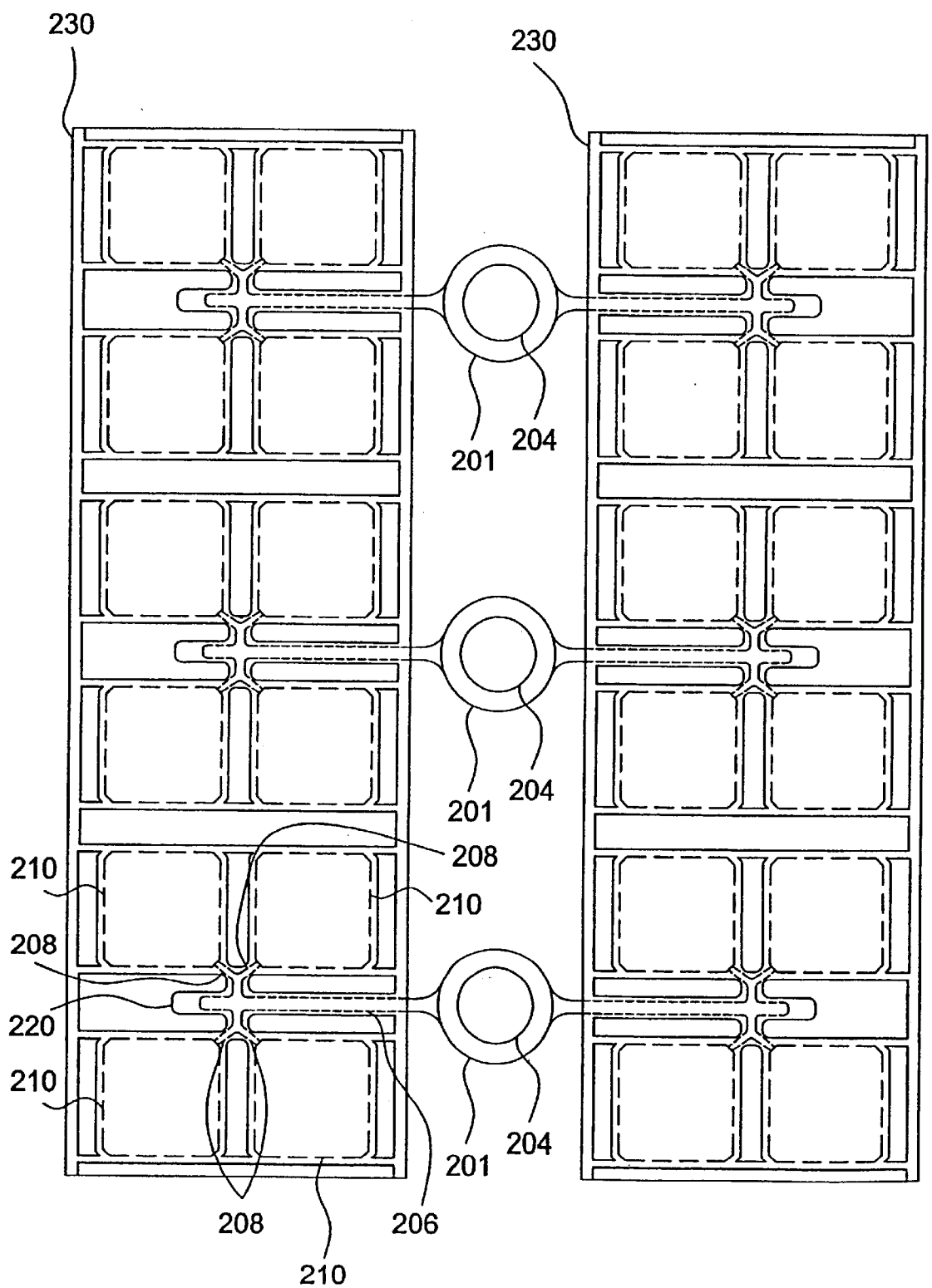
FIG. 1 is a top plan view of conventional flexible substrate strips placed in a conventional molding equipment.
Figure 2:
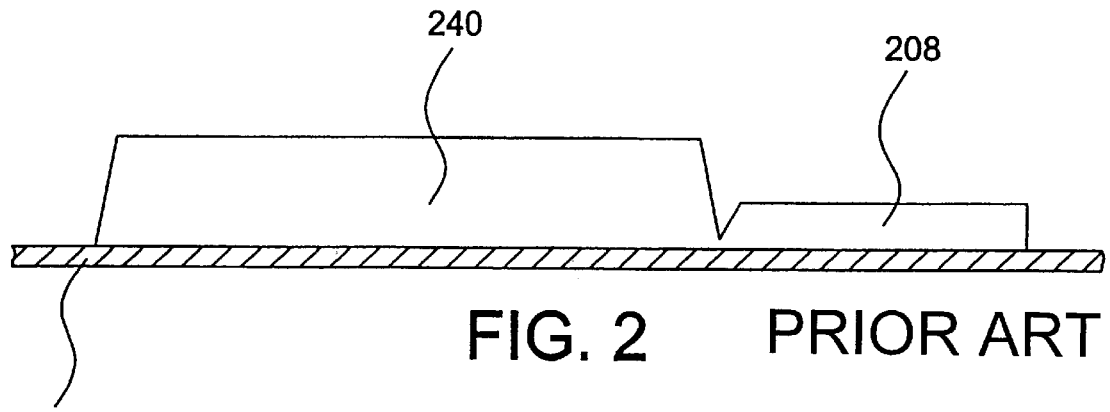
FIG. 2 is a side view of a packaged product with to-be-removed excess encapsulant.
Figure 3:
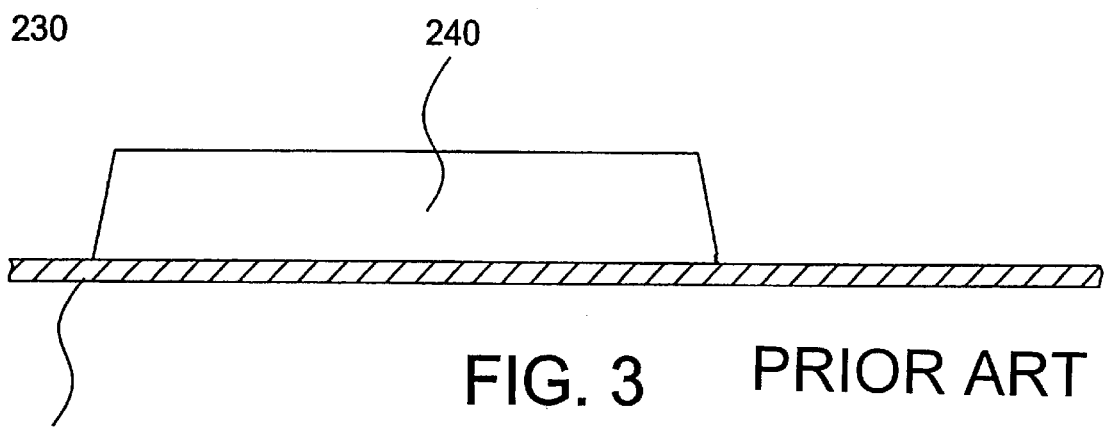
FIGS. 3–5 illustrates three different results of the packaged product of FIG. 2 after removing the excess encapsulant.
Figure 4:
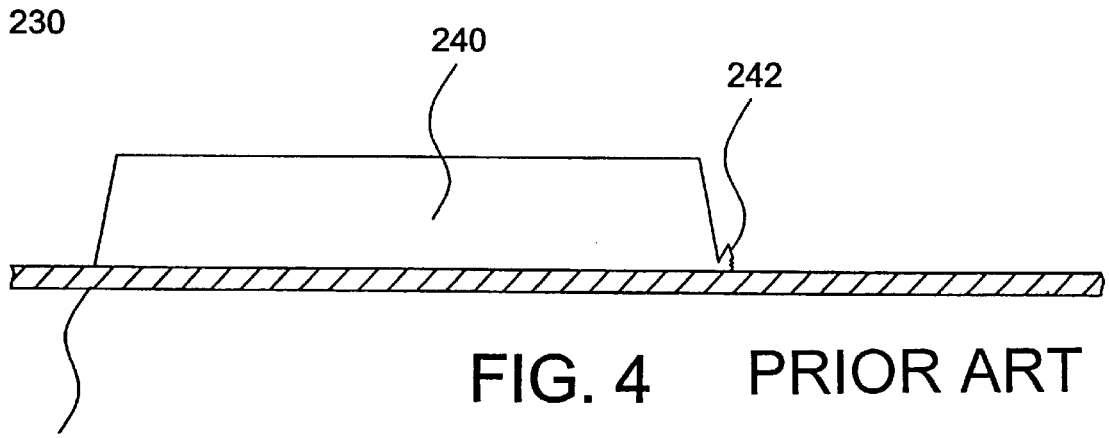
Figure 5:
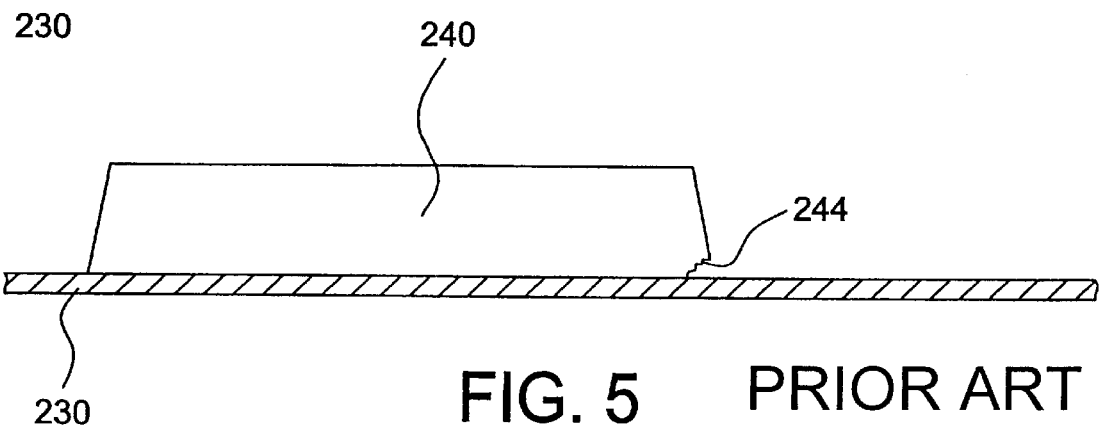
Figure 6:
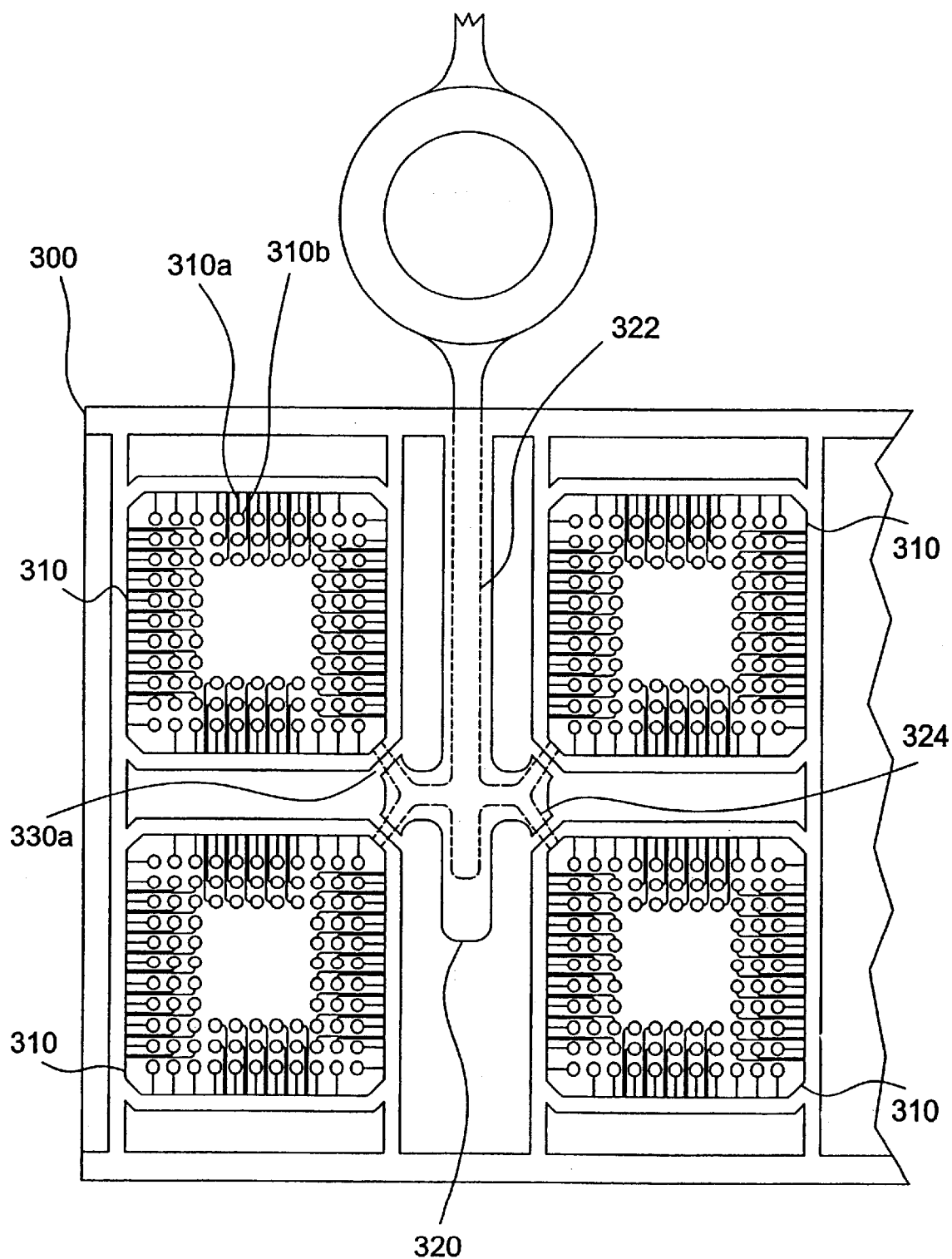
FIG. 6 is a top plan view of a portion of a flexible substrate strip according to a first embodiment of the present invention placed in a conventional molding equipment.

FIG. 6 is a plan view of a portion of a flexible substrate strip 300 according to a first embodiment of the present invention placed in a conventional molding equipment. The flexible substrate strip 300 comprises a plurality of substrate units 310. Each substrate unit 310 is adapted for mounting a semiconductor chip. Though only four substrate units 310 of the flexible substrate strip 300 are shown in FIG. 6, a flexible substrate strip for use with the invention can include any numbers of substrate units that is compatible with the manufacturing equipment, e.g., mold, being used.

Each substrate unit 310 is provided with a plurality of leads 310a and connection pads 310b. Each lead 310a has one end adapted for electrical connecting to a semiconductor chip (not shown) and the other end connected to the corresponding connection pad 310b. The connection pads 310b are disposed corresponding to through-holes (not shown) formed in the substrate strip. Each connection pad 310b has at least a portion exposed within corresponding through-hole for mounting a solder ball (not shown).

The flexible substrate strip 300 is provided with a plurality of degating regions 320 (only one is shown in FIG. 6) at locations such that the edges of mold runners 322 and gates 324 of a mold used to encapsulate the semiconductor chips in encapsulant material fit entirely within the degating regions 320 during encapsulation of the semiconductor chips. Each degating region 320 has a buffer region 330a at a location corresponding to the gate 324 of the mold during encapsulation.

Figure 7:
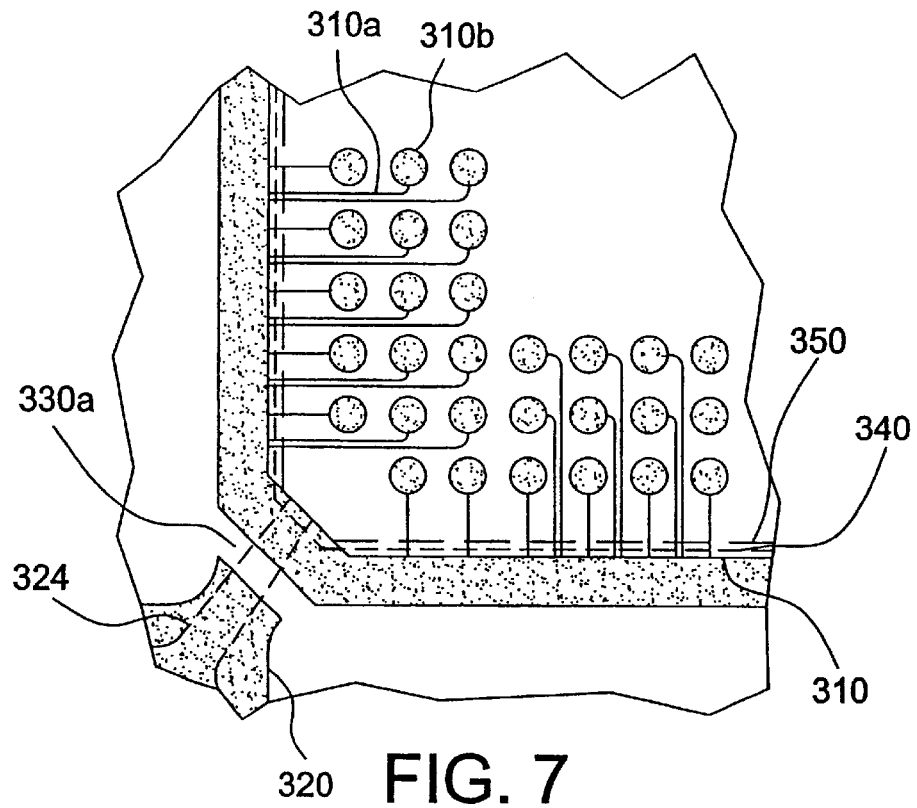
FIG. 7 is a detailed plan view of a portion of the flexible substrate strip according to the first embodiment of the present invention placed in a conventional molding equipment.

FIG. 7 is a detailed plan view of a portion of the flexible substrate strip 300 placed in a conventional molding equipment for further illustrating the buffer region 330a. Compound line 350 is the outline of package body enclosed the semiconductor chip. After degating process, the molded product is cut into individual units along the punch line 340 thereby obtaining the finished semiconductor chip packages. A degating region material is formed on the degating region 320 with the buffer region 330a not coated with the degating region material in a manner that a rectangular gap appears at a location corresponding to the buffer region 330a. Preferably, the width of the rectangular gap is 0.13 mm. The adhesive force between the encapsulant material and the degating region material is approximately 10% of the adhesive force between the encapsulant material and the substrate strip. Therefore, the better adhesion of the encapsulant to the surface of the buffer region 330a helps to alleviate the violent breaking force during degating process thereby rendering the breaking surface formed on the packaged product more regular.

Figure 8:
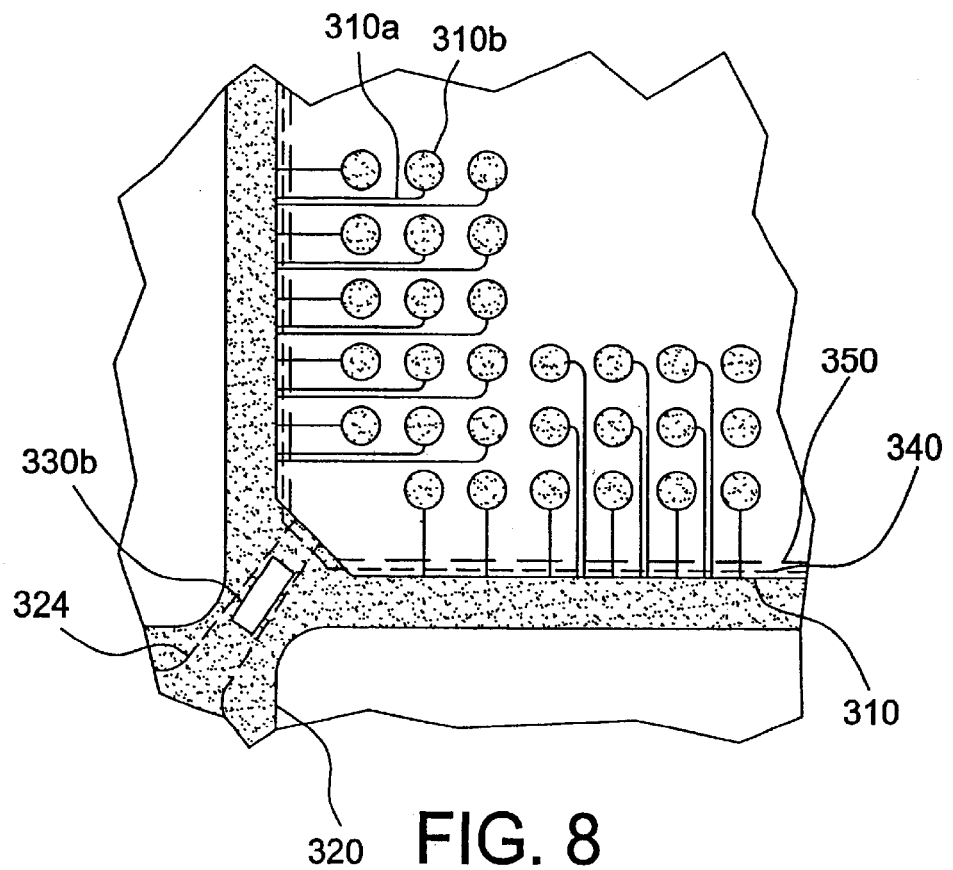
FIG. 8 a detailed plan view of a portion of a flexible substrate strip according to a second embodiment of the present invention placed in a conventional molding equipment.

FIG. 8 is a detailed plan view of a portion of a flexible substrate strip according to a second embodiment of the present invention placed in a conventional molding equipment. The flexible substrate strip according to the second, embodiment of the present invention is substantially identical to the flexible substrate strip 300 of FIG. 6 with exception that the buffer region 320b of the degating region 320 is at a different location. The buffer region 320b is a rectangular region entirely located within the area covered by the gate 324 of the mold. The adhesive force between the encapsulant material and the degating region material is approximately 10% of the adhesive force between the encapsulant material and the substrate strip. Therefore, the better adhesion of the encapsulant to the surface of the buffer region 330b helps to alleviate the violent breaking force during degating process thereby rendering the breaking surface formed on the packaged product more regular.

Figure 9:
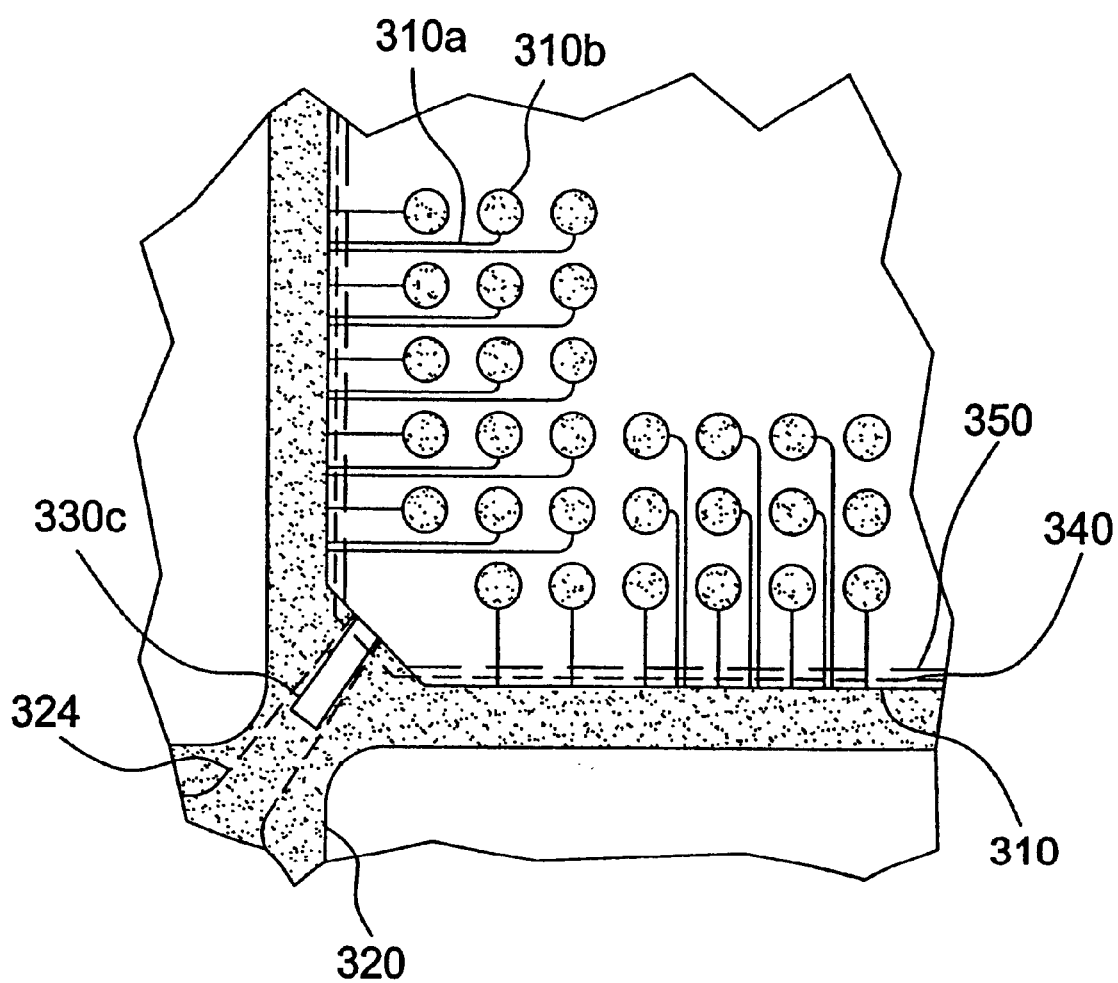
FIG. 9 a detailed plan view of a portion of a flexible substrate strip according to a third embodiment of the present invention placed in a conventional molding equipment.

FIG. 9 is a detailed plan view of a portion of a flexible substrate strip according to a third embodiment of the present invention placed in a conventional molding equipment. The flexible substrate strip according to the third embodiment of the present invention is substantially identical to the flexible substrate strip 300 of FIG. 6 with exception that the buffer region 320c of the degating region 320 is at a different location. The buffer region 320c is located next to the substrate unit 310. The adhesive force between the encapsulant material and the degating region material is approximately 10% of the adhesive force between the encapsulant material and the substrate strip. Therefore, the better adhesion of the encapsulant to the surface of the buffer region 330b helps to alleviate the violent breaking force during degating process thereby rendering the breaking surface formed on the packaged product more regular.

The method of making the flexible substrate strip for use in forming a plurality of semiconductor chip packages in accordance with the present invention is as follows:

(A) A plurality of through-holes are formed in a flexible substrate by conventional punching technique. The flexible substrate may be a resin film. Preferably, the flexible substrate is made of polyimide.

(B) An electrically conductive metal layer such as copper foil is laminated on the flexible substrate by conventional method such as thermocompression.

(C) The metal layer is etched to form a plurality of leads 310a, a plurality of connection pads 310b, and a metal covering defining a plurality of degating regions 320 wherein each buffer region 330a has no metal covering formed thereon. The step (C) includes forming a photoresist layer over the metal layer, pattern transferring by photolithography, removing the unprotected portion of the metal layer to form corresponding leads 310a, connection pads 310b, and the metal covering on degating regions 320 by etching, and finally removing the remaining photoresist layer.

Each lead 310a has one end adapted for electrical connecting to a semiconductor chip and the other end connected to the corresponding connection pad. The connection pads are disposed corresponding to the through-holes. Since the through-holes are covered by the connection pads, they are not shown in FIG. 6. Further, the backside surface of each connection pad 310b has at least a portion exposed within corresponding through-hole for mounting a solder ball (not shown).

The degating region 320 is located such that the edge of mold runner 322 and gate 324 of the mold fit entirely within the degating region 320. The buffer region 330a is at a location corresponding to the gate of the mold during encapsulation.

(D) A degating region material is formed on the leads 310a, the connection pads 310b, and the metal covering on the degating regions 320. The degating region material can be electroplated using conventional techniques so that the degating region material is formed only on the metal layer. Since the degating region material is also formed on the leads 310a adapted for electrical connecting to a semiconductor chip, the degating region material must be a material that allows a good bond to the conventional bonding wire material. Further, the adhesive force between the encapsulant material and the degating region material should be less than the adhesive force between the encapsulant material and the substrate strip. Thus, gold is a suitable degating region material.

According to the flexible substrate of the present invention, since the buffer regions have no degating region material formed thereon, the surface of the buffer regions has the same characteristics as the substrate strip. Accordingly, the better adhesion of the encapsulant to the surface of the buffer regions helps to alleviate the violent breaking force during degating process thereby rendering the breaking surface formed on the packaged product more regular.

Further, during the degating process, runners are peeled off first and gates are removed later. Accordingly, the buffer regions of the flexible substrate strip of the present invention are disposed corresponding to the gates of a mold thereby providing best buffering effect whereby the breaking surface formed on the packaged product is substantially regular to avoid damaging the punch tool, harming electrically conductive traces on the flexible substrate strip, or weakening the seal between the molded body and the substrate.

Although the invention has been explained in relation to its preferred embodiment, it is to be understood that many other possible modifications and variations can be made without departing from the spirit and scope of the invention as hereinafter claimed.

What is claimed is:

1. A method of making a flexible substrate strip for use in forming a plurality of semiconductor chip packages, said method comprising the steps of:

providing a flexible substrate;

forming a plurality of through-holes in the flexible substrate;

laminating an electrically conductive metal layer on the flexible substrate;

etching the metal layer to form a plurality of leads, a plurality of connection pads, and a metal covering defining at least one degating region; wherein each lead has one end adapted for electrical connecting to a semiconductor chip and the other end connected to the corresponding connection pad;

the connection pads are disposed corresponding to the through-holes;

said at least one degating region is located such that an entire area, except for at least one buffer region, of mold runners and gates of a mold used to encapsulate the semiconductor chips in encapsulant material fits entirely within said at least one degating region when the substrate strip is placed in the mold during encapsulation of the semiconductor chips; and said at least one buffer region is located corresponding to one of the gates of the mold during encapsulation and is free of said metal covering; and forming a degating region material on the leads, the connection pads, and the metal covering on said at least one degating region, wherein an adhesive force between the encapsulant material and the degating region material is less than that between the encapsulant material and the flexible substrate.

2. The method as claimed in claim 1, wherein the degating region material is gold.

3. The method as claimed in claim 1, wherein the flexible substrate is a resin film.

4. The method as claimed in claim 1, wherein the flexible substrate is made of polyimide.

5. The method of claim 1, wherein the buffer regions are free of said degating region material.

6. The method of claim 5, wherein the degating region material is gold.

7. The method of claim 5, wherein the flexible substrate is a resin film.

8. The method of claim 5, wherein the flexible substrate is made of polyimide.

9. A method of making a substrate strip for use in forming a plurality of semiconductor chip packages, said method comprising the steps of:

providing a flexible substrate;

forming a plurality of through-holes in the flexible substrate;

laminating an electrically conductive metal layer on the flexible substrate;

etching the metal layer to form a plurality of leads, a plurality of connection pads, and a metal covering defining at least one degating region, wherein each lead has one end adapted for electrical connecting to a semiconductor chip and the other end connected to the corresponding connection pad;

the plurality of connection pads are disposed corresponding to the through-holes;

said at least one degating region is located such that an entire area, except for at least one buffer region, of mold runners and gates of a mold used to encapsulate the semiconductor chips in encapsulant material fits within said at least one degating region when the substrate strip is placed in the mold during encapsulation of the semiconductor chips; and said at least one buffer region is located corresponding to one of the gates of the mold during encapsulation and is free of said metal covering; and forming a degating material on the leads, the connection pads, and said metal covering of said at least one degating region, wherein an adhesive force between the encapsulant material and the degating material is less than that between the encapsulant material and the flexible substrate each of the connection pads has at least one portion exposed in the corresponding through-hole for mounting a solder ball.

10. A method of making a substrate strip for use in forming a plurality of semiconductor chip packages, said method comprising the steps of:

providing a flexible substrate;

forming a plurality of through-holes in the flexible substrate;

laminating an electrically conductive metal layer on the flexible substrate;

etching the metal layer to form a plurality of leads, a plurality of connection pads, and a metal covering defining at least one degating region, wherein each lead has one end adapted for electrical connecting to a semiconductor chip and the other end connected to the corresponding connection pad;

the plurality of connection pads are disposed corresponding to the through-holes;

said at least one degating region is located such that an entire area, except for at least one buffer region, of mold runners and gates of a mold used to encapsulate the semiconductor chips in encapsulant material fits within said at least one degating region when the substrate strip is placed in the mold during encapsulation of the semiconductor chips; and said at least one buffer region is located corresponding to one of the gates of the mold during encapsulation and is free of said metal covering; and forming a degating material on the leads, the connection pads, and said metal covering of said at least one degating region, wherein an adhesive force between the encapsulant material and the degating material is less than that between the encapsulant material and the flexible substrate;

wherein the degating material is formed with at least one gap corresponding to said at least one buffer region.

11. A method of making a substrate strip for use in forming a plurality of semiconductor chip packages, said method comprising the steps of:

providing a flexible substrate;

forming a plurality of through-holes in the flexible substrate;

laminating an electrically conductive metal layer on the flexible substrate;

etching the metal layer to form a plurality of leads, a plurality of connection pads, and a metal covering defining at least one degating region, wherein each lead has one end adapted for electrical connecting to a semiconductor chip and the other end connected to the corresponding connection pad;

the plurality of connection pads are disposed corresponding to the through-holes;

said at least one degating region is located such that an entire area, except for at least one buffer region, of mold runners and gates of a mold used to encapsulate the semiconductor chips in encapsulant material fits within said at least one degating region when the substrate strip is placed in the mold during encapsulation of the semiconductor chips; and said at least one buffer region is located corresponding to one of the gates of the mold during encapsulation and is free of said metal covering; and forming a degating material on the leads, the connection pads, and said metal covering of said at least one degating region, wherein an adhesive force between the encapsulant material and the degating material is less than that between the encapsulant material and the flexible substrate;

wherein said at least one buffer region is entirely located within an area covered by the corresponding gate of the mold during encapsulation of the semiconductor chips.

* * * * *